US010775676B2

(12) United States Patent
Kim et al.

(10) Patent No.: US 10,775,676 B2
(45) Date of Patent: Sep. 15, 2020

(54) DISPLAY DEVICE

(71) Applicant: Samsung Display Co., Ltd., Yongin-si (KR)

(72) Inventors: Kyung Ho Kim, Seongnam-si (KR); Seong Young Lee, Hwaseong-si (KR); Yong Hee Lee, Suwon-si (KR); Byoung Sun Na, Seoul (KR); Sun Kwun Son, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/360,009

(22) Filed: Mar. 21, 2019

(65) Prior Publication Data

US 2020/0089068 A1 Mar. 19, 2020

(30) Foreign Application Priority Data

Sep. 18, 2018 (KR) ........................ 10-2018-0111774

(51) Int. Cl.
| | |
|---|---|
| *H01L 27/12* | (2006.01) |
| *G02F 1/1362* | (2006.01) |
| *G02F 1/1333* | (2006.01) |
| *G02F 1/1343* | (2006.01) |
| *G02F 1/1368* | (2006.01) |
| *H01L 27/146* | (2006.01) |

(52) U.S. Cl.
CPC ...... *G02F 1/136286* (2013.01); *G02F 1/1368* (2013.01); *G02F 1/13439* (2013.01);
(Continued)

(58) Field of Classification Search
CPC .............. H01L 27/1214; H01L 27/124; H01L 27/1255; H01L 27/14605; H01L 27/14612;
(Continued)

(56) References Cited

U.S. PATENT DOCUMENTS

| | | | |
|---|---|---|---|
| 9,857,641 | B2 | 1/2018 | Shin et al. |
| 9,857,654 | B2 | 1/2018 | Kim et al. |

(Continued)

FOREIGN PATENT DOCUMENTS

| | | |
|---|---|---|
| KR | 10-2017-0005335 | 1/2017 |
| KR | 10-2017-0062562 | 6/2017 |

(Continued)

*Primary Examiner* — Stephen W Smoot
(74) *Attorney, Agent, or Firm* — H.C. Park & Associates, PLC (57) ABSTRACT

A display device including: a substrate; a gate line disposed on the substrate to transmit a gate signal; a first reference voltage line spaced apart from the gate line to transmit a reference voltage; a second reference voltage line disposed on the gate line and the first reference voltage line and electrically connected to the first reference voltage line; an insulating layer disposed on the second reference voltage line; and a pixel electrode layer disposed on the insulating layer, wherein the pixel electrode layer includes a first pixel electrode having a first sub-pixel electrode disposed at a first side with respect to the gate line and a second sub-pixel electrode disposed at a second side opposite to the first side with respect to the gate line, and the second reference voltage line may overlap the first pixel electrode and may cross the first pixel electrode.

20 Claims, 8 Drawing Sheets

(52) U.S. Cl.
CPC .. *G02F 1/133345* (2013.01); *G02F 1/134309* (2013.01); *G02F 1/136227* (2013.01); *H01L 27/1214* (2013.01); *H01L 27/14605* (2013.01); *H01L 27/14612* (2013.01); *G02F 2001/134345* (2013.01); *G02F 2001/136222* (2013.01); *G02F 2201/40* (2013.01)

(58) Field of Classification Search
CPC ......... H01L 27/14614; G02F 1/134309; G02F 1/1345; G02F 1/13452; G02F 1/136227; G02F 1/136286; G02F 1/1368; G02F 2001/134345; G02F 2001/136222; G02F 2001/13629
See application file for complete search history.

(56) References Cited

U.S. PATENT DOCUMENTS

| | | | |
|---|---|---|---|
| 9,904,111 | B2 | 2/2018 | Lee et al. |
| 10,437,121 | B2 * | 10/2019 | Lee .................. G02F 1/136213 |
| 2006/0187391 | A1 * | 8/2006 | Hwang ............... G02F 1/13394 349/114 |
| 2011/0096279 | A1 * | 4/2011 | Lee .................... G02F 1/13394 349/139 |
| 2015/0042939 | A1 * | 2/2015 | Park ................. G02F 1/134336 349/144 |
| 2015/0168772 | A1 * | 6/2015 | Jung .................. G02F 1/13394 349/106 |
| 2015/0198851 | A1 * | 7/2015 | Park ................. G02F 1/134309 349/46 |
| 2016/0195759 | A1 * | 7/2016 | Won .................. G02F 1/133377 349/43 |
| 2017/0184932 | A1 * | 6/2017 | Park ................. G02F 1/136209 |
| 2018/0039110 | A1 | 2/2018 | Huh et al. |
| 2018/0095333 | A1 * | 4/2018 | Lin ....................... G02F 1/1368 |

FOREIGN PATENT DOCUMENTS

| | | |
|---|---|---|
| KR | 10-2017-0077912 | 7/2017 |
| KR | 10-2017-0115135 | 10/2017 |

* cited by examiner

DISPLAY DEVICE

CROSS REFERENCE TO RELATED APPLICATION

This application claims priority from and the benefit of Korean Patent Application No. 10-2018-0111774, filed on Sep. 18, 2018, which is hereby incorporated by reference for all purposes as if fully set forth herein.

BACKGROUND

Field

Exemplary embodiments of the invention relate generally to a display device.

Discussion of the Background

A display device such as a liquid crystal display (LCD), an organic light emitting diode (OLED) display, or the like generally includes a plurality of pixels that are units for displaying an image.

The display panel of a liquid crystal display includes a liquid crystal layer including liquid crystal molecules, electric field generating electrodes for controlling alignment of the liquid crystal molecules in the liquid crystal layer, a plurality of signal lines for applying a voltage to at least some of the electric field generating electrodes, and a plurality of switching elements connected thereto. When a voltage is applied to the electric field generating electrodes, an electric field is generated in the liquid crystal layer, and thus the liquid crystal molecules are re-aligned. Accordingly, an image can be displayed by adjusting an amount of transmitted light. The display panel may include at least one polarizer to control an amount of transmitted light.

The electric field generating electrodes included in the liquid crystal display include a pixel electrode for receiving a data voltage and a common electrode for receiving a common voltage. The pixel electrode may receive a data voltage through the switching element which may be formed of, e.g., a thin film transistor.

The above information disclosed in this Background section is only for understanding of the background of the inventive concepts, and, therefore, it may contain information that does not constitute prior art.

SUMMARY

Devices constructed according to exemplary embodiments of the invention provide a display device that may have an increased aperture ratio and transmittance.

Additional features of the inventive concepts will be set forth in the description which follows, and in part will be apparent from the description, or may be learned by practice of the inventive concepts.

An exemplary embodiment of the present invention provides a display device including: a substrate; a gate line disposed on the substrate and configured to transmit a gate signal; a first reference voltage line spaced apart from the gate line and configured to transmit a reference voltage; a second reference voltage line disposed on the gate line and the first reference voltage line and electrically connected to the first reference voltage line; an insulating layer disposed on the second reference voltage line; and a pixel electrode layer disposed on the insulating layer, wherein the pixel electrode layer may comprise a first pixel electrode comprising a first sub-pixel electrode disposed at a first side with respect to the gate line in a plan view and a second sub-pixel electrode disposed at a second side opposite to the first side with respect to the gate line in the plan view, and the second reference voltage line may overlap the first pixel electrode and may cross the first pixel electrode.

Another exemplary embodiment of the present invention provides a display device including: a substrate; a gate line disposed on the substrate and configured to transmit a gate signal; a plurality of data lines disposed on the substrate, configured to transmit a data voltage, and crossing the gate line; an insulating layer disposed on the plurality of data lines; and a plurality of color filters disposed on the insulating layer, wherein one of the plurality of color filters may have an opening overlapping three or more contact holes arranged in a line and provided in the insulating layer.

Another exemplary embodiment of the present invention provides a display device including: a gate line configured to transmit a gate signal; a first reference voltage line spaced apart from the gate line and configured to transmit a reference voltage; a plurality of data lines crossing the gate line and the first reference voltage line; a first transistor to be electrically connected to the gate line and the data line; a second transistor electrically connected to the gate line and the data line; a third transistor electrically connected to the second transistor; and a second reference voltage line configured to transmit the reference voltage and disposed in a different conductive layer from the first reference voltage line, wherein a drain electrode included in the third transistor may be electrically connected to the first reference voltage line, the second reference voltage line may include the drain electrode of the third transistor, and the second reference voltage line may cross the first reference voltage line.

According to the embodiments of the present invention, it is possible to increase an aperture ratio and transmittance of a display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

First, a display device according to an exemplary embodiment will be described with reference to FIG. 1.

Figure 1:
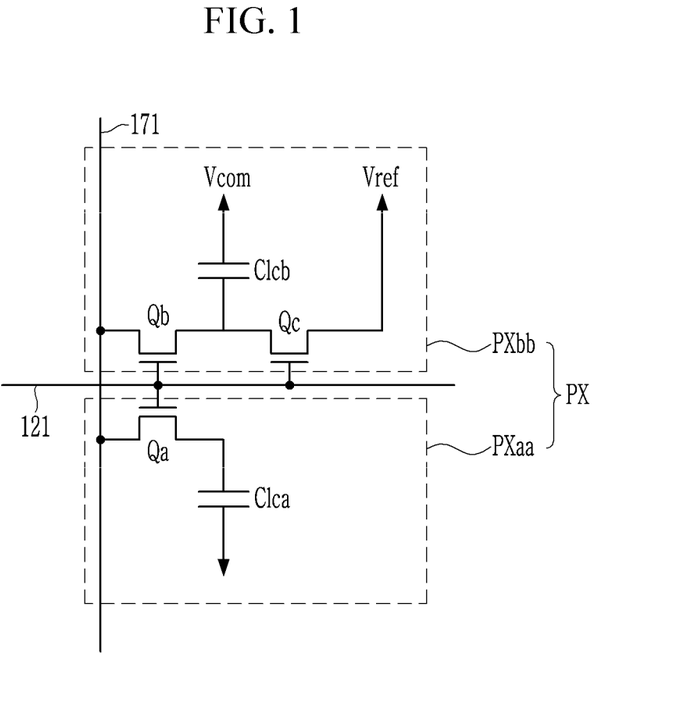
FIG. 1 illustrates an equivalent circuit diagram for one pixel of a display device according to an embodiment.

FIG. 1 illustrates an equivalent circuit diagram for one pixel PX of a display device according to an exemplary embodiment.

The display device according to the exemplary embodiment includes a plurality of pixels PX that are used as a unit for displaying an image. Referring to FIG. 1, one pixel PX may include a first sub-pixel PXaa and a second sub-pixel PXbb. The first sub-pixel PXaa may include a first transistor Qa connected to one data line 171 and one gate line 121, and a first liquid crystal capacitor Clca connected to the first transistor Qa. The second sub-pixel PXbb may include a second transistor Qb and a third transistor Qc connected to one data line 171 and one gate line 121, and a second liquid crystal capacitor Clcb connected to the second transistor Qb and the third transistor Qc.

The first transistor Qa includes a gate electrode connected to the gate line 121, a source electrode connected to the data line 171, and a drain electrode connected to the first liquid crystal capacitor Clca. The first transistor Qa may be controlled according to a gate signal transmitted from the gate line 121 to transmit a data voltage transmitted from the data line 171 to the first liquid crystal capacitor Clca.

The second transistor Qb includes a gate electrode connected to the gate line 121 like the first transistor Qa, a source electrode connected to the data line 171, and a drain electrode connected to one side of the second liquid crystal capacitor Clcb and a source electrode of the third transistor Qc. The second transistor Qb may be controlled according to a gate signal transmitted from the gate line 121 to transmit a data voltage transmitted from the data line 171 to the second liquid crystal capacitor Clcb. The other side of the second liquid crystal capacitor Clcb may be attached to a common voltage Vcom.

The third transistor Qc is connected to a gate electrode connected to the gate line 121 like the first transistor Qa, a source electrode connected to the drain electrode of the second transistor Qb, and a drain electrode connected to a reference voltage Vref. The third transistor Qc is controlled according to a gate signal transmitted from the gate line 121, and when the third transistor Qc and the second transistor Qb are turned on, the data voltage transmitted from the data line 171 is divided by the second transistor Qb and the third transistor Qc to be transmitted to the second liquid crystal capacitor Clcb. The reference voltage Vref may be a predetermined constant voltage.

The first sub-pixel PXaa and the second sub-pixel PXbb may display images depending on different gamma curves or display an image depending on the same gamma curve, with respect to one image signal. Here, the gamma curve means a curve showing a change in luminance or transmittance with respect to a gray of the image signal.

The gamma curve applied to the second sub-pixel PXbb can be adjusted by controlling a resistance ratio of the third transistor Qc and the second transistor Qb, the reference voltage Vref, and the like. A charging voltage of the second liquid crystal capacitor Clcb may be adjusted by controlling the third transistor Qc, the reference voltage Vref, and the like, to differentiate the luminance of the two sub-pixels PXaa and PXbb, and the charging voltages of the first liquid crystal capacitor Clca and the second liquid crystal capacitor Clcb may be appropriately adjusted to improve side visibility of the display device.

A specific structure of a display device according to an exemplary embodiment will be described with reference to FIG. 2 to FIG. 6 together with FIG. 1.

Figure 2:
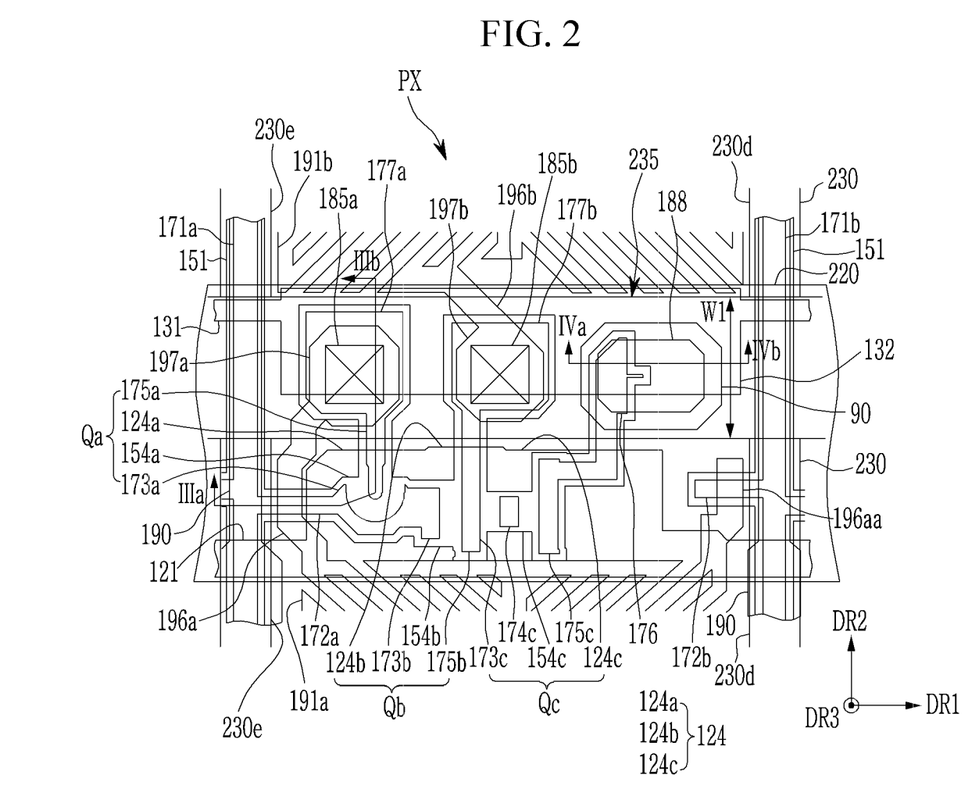
FIG. 2 illustrates a layout diagram of a part of one pixel of a display device according to an embodiment.
Figure 3:
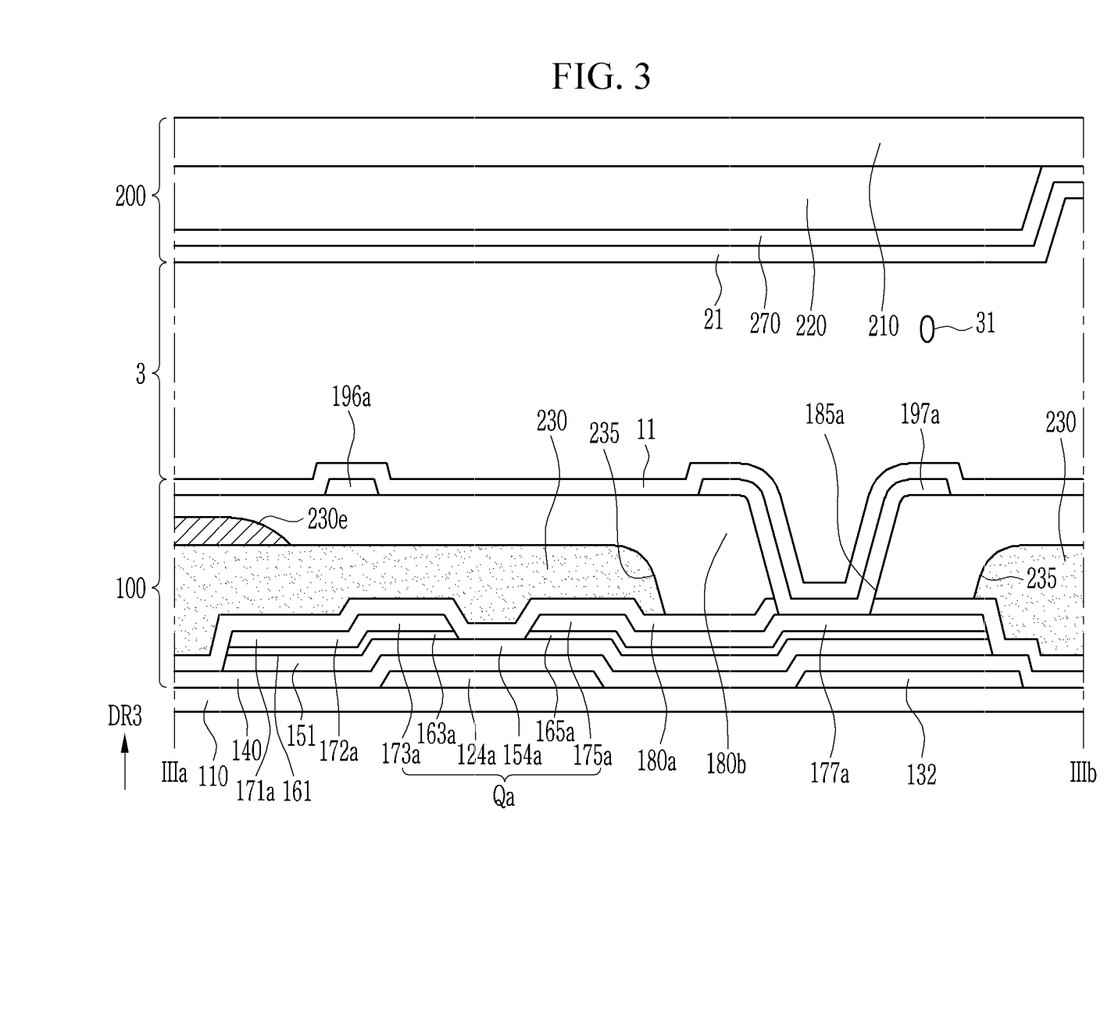
FIG. 3 illustrates a cross-sectional view of the display device shown in FIG. 2 taken along line IIIa-IIIb.
Figure 4:
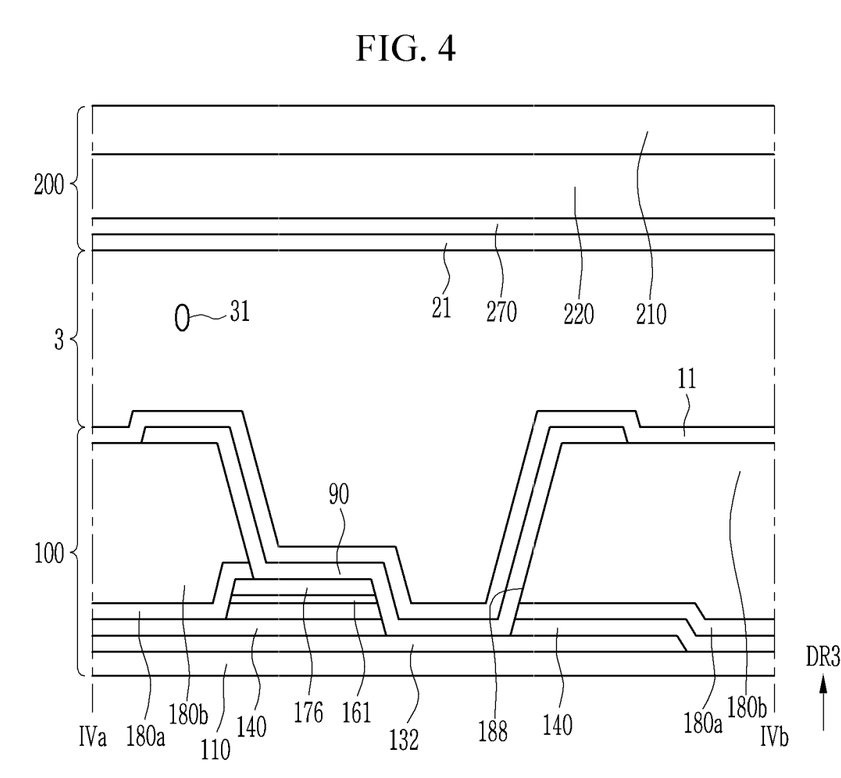
FIG. 4 illustrates a cross-sectional view of the display device shown in FIG. 2 taken along line IVa-IVb.
Figure 5:
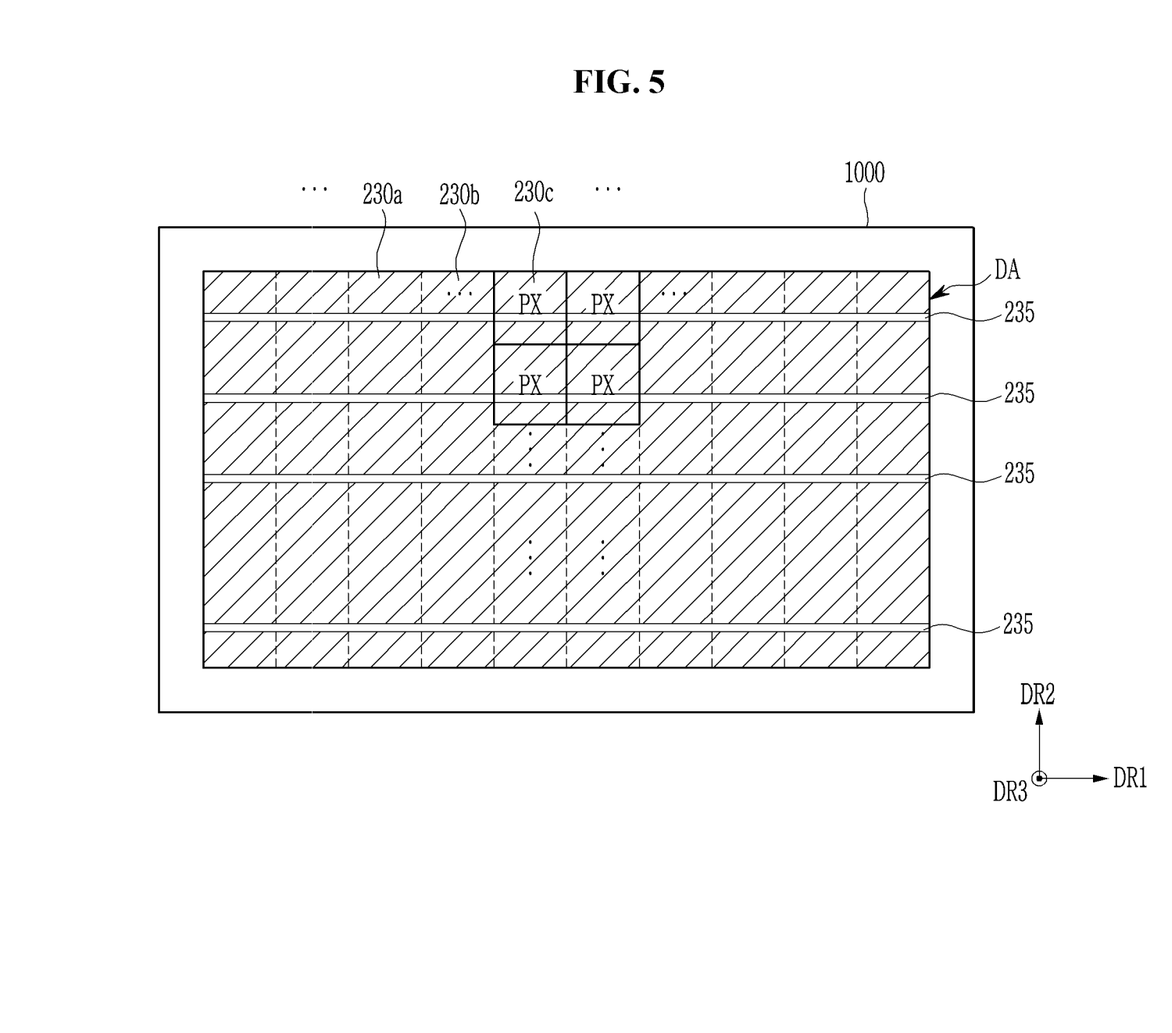
FIG. 5 illustrates a plan layout view of a display area of a display device according to an embodiment.
Figure 6:
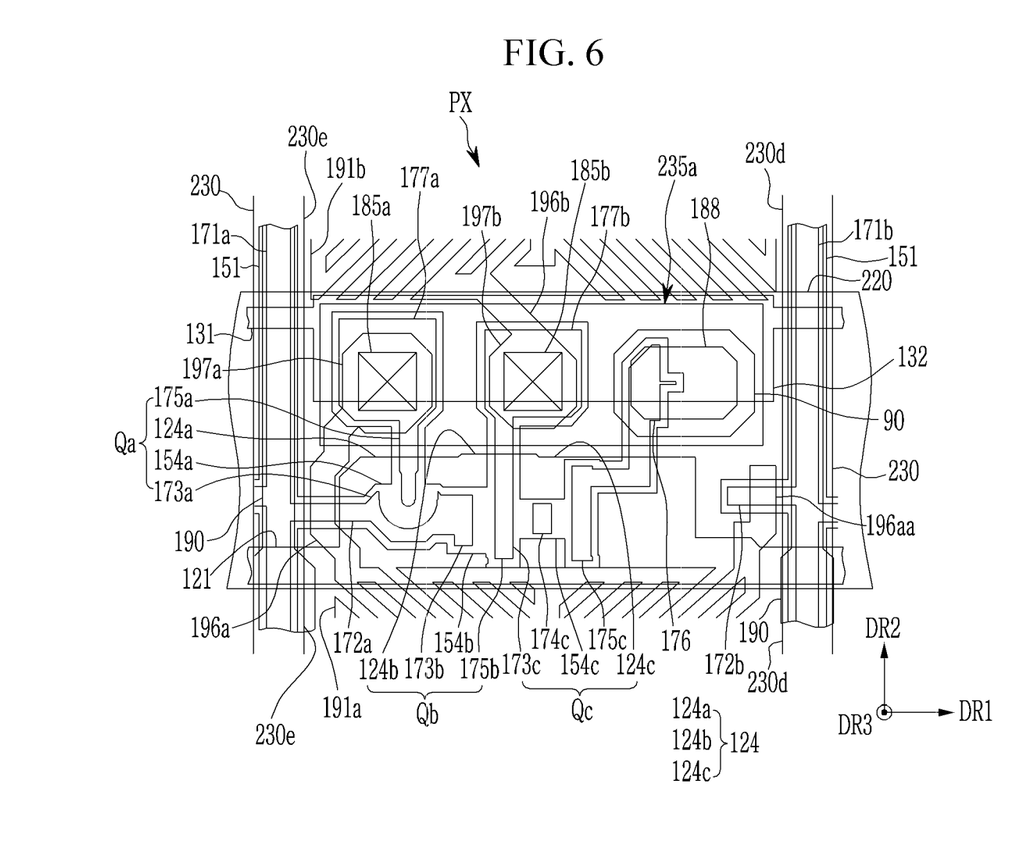
FIG. 6 illustrates a layout diagram of a part of one pixel of a display device according to an embodiment.

FIG. 2 illustrates a layout diagram of a part of one pixel PX of a display device according to an exemplary embodiment, FIG. 3 illustrates a cross-sectional view of the display device shown in FIG. 2 taken along line IIIa-IIIb, FIG. 4 illustrates a cross-sectional view of the display device shown in FIG. 2 taken along line IVa-IVb, FIG. 5 illustrates a plan layout view of a display area of a display device according to an exemplary embodiment, and FIG. 6 illustrates a layout diagram of a part of one pixel of a display device according to an exemplary embodiment.

The display device according to the exemplary embodiment, which is a liquid crystal display, may include a first display panel 100 and a second display panel 200, and a liquid crystal layer 3 disposed between the two display panels 100 and 200.

In the first display panel 100, a gate conductive layer including a plurality of gate lines 121 and a reference voltage line 131 is disposed on an insulating substrate 110.

The gate line 121 may transmit the gate signal and may substantially extend in a first direction DR1. The gate line 121 may include a first gate electrode 124a, a second gate electrode 124b, and a third gate electrode 124c. The first gate electrode 124a, the second gate electrode 124b, and the third gate electrode 124c are connected to each other, and may be included in one expansion 124 of the gate line 121.

The expansion 124 may have a shape protruding or extending in the first direction DR1 from a portion of which the gate line 121 is extended long to be parallel to the first direction DR1.

The second gate electrode 124b may be disposed between the first gate electrode 124a and the third gate electrode 124c.

The reference voltage line 131 may transmit the reference voltage Vref, and may be spaced apart from the gate line 121 to substantially extend in parallel to the gate line 121. The reference voltage line 131 may cross a plurality of data lines 171a and 171b described later, and may extend across the plurality of pixels PX, together with the gate line 121.

The reference voltage line 131 may include an expansion 132. The expansion 132 may protrude or extend in a direction opposite to the first direction DR1 from a portion of the reference voltage line 131 extending in parallel to the first direction DR1. That is, a direction in which the expansion 124 protrudes from the gate line 121 and a direction in which the expansion 132 protrudes from the reference voltage line 131 may be opposite to each other. In other words, the expansion 124 of the gate line 121 and the expansion 132 of the reference voltage line 131 are disposed between the portion of the gate line 121 extending in the first direction DR1 and the portion of the reference voltage line 131 extending in the first direction DR1, and the expansion 124 and the expansion 132 may face each other.

A gate insulating layer 140 may be disposed on the gate conductive layer. The gate insulating layer 140 may include an insulating material such as a silicon nitride ($SiN_x$), a silicon oxide ($SiO_x$), a silicon oxynitride, or the like.

A semiconductor layer 151 including a first semiconductor 154a, a second semiconductor 154b, and a third semiconductor 154c is disposed on the gate insulating layer 140. The first semiconductor 154a is disposed on the first gate electrode 124a to overlap the first gate electrode 124a, the second semiconductor 154b is disposed on the second gate electrode 124b to overlap the second gate electrode 124b, and the third semiconductor 154c is disposed on the third gate electrode 124c to overlap the third gate electrode 124c. The first semiconductor 154a, the second semiconductor 154b, and the third semiconductor 154c may be connected to each other, and the second semiconductor 154b may be disposed between the first semiconductor 154a and the third semiconductor 154c.

The semiconductor layer 151 may include amorphous silicon, polycrystalline silicon, or a metal oxide.

An ohmic contact layer 161 including a plurality of ohmic contact members 163a and 165a may be disposed on the semiconductor layer 151.

A data conductive layer including a plurality of data lines 171a and 171b, a first source electrode 173a, a second source electrode 173b, a third source electrode 173c, a first drain electrode 175a, a second drain electrode 175b, and a third drain electrode 175c is disposed on the ohmic contact layer 161.

The first source electrode 173a and the second source electrode 173b are connected to each other, and the first source electrode 173a is connected to one data line 171a. The first drain electrode 175a may include an end portion facing the first source electrode 173a and surrounded by the first source electrode 173a, and an expansion 177a disposed at the other side thereof. The second drain electrode 175b may include an end portion facing the second source electrode 173b and extending in parallel to the second source electrode 173b, and an expansion 177b disposed at the other side thereof. At least a part of the second drain electrode 175b may be a third source electrode 173c. The third drain electrode 175c may include one end portion facing the third source electrode 173c, and another one end portion 176. The third drain electrode 175c extends in the second direction DR2 from one end portion facing the third source electrode 173c, is bent to extend in the first direction DR1, and then is bent to extend in the second direction DR2, thereby forming another one end portion 176.

The data conductive layer may further include an auxiliary electrode 174c disposed between the third source electrode 173c and the third drain electrode 175c. The auxiliary electrode 174c, which has an island shape, overlaps the third semiconductor 154c and the third gate electrode 124c.

An expansion 177a of the first drain electrode 175a, an expansion 177b of the second drain electrode 175b, and an end portion 176 of the third drain electrode 175c are disposed at one side based on the gate line 121, and may be substantially arranged in the first direction DR1.

For example, as shown in FIG. 2, the expansion 177a of the first drain electrode 175a, the expansion 177b of the second drain electrode 175b, and the end portion 176 of the third drain electrode 175c may be disposed on an upper side of the gate line 121, and may be arranged in the first direction DR1 in the order of the expansion 177a, the expansion 177b, and the end portion 176 of the third drain electrode 175c from the left.

At least a part of each of the expansion 177a, the expansion 177b, and the third drain electrode 175c may overlap the expansion 132 of the reference voltage line 131.

The data lines 171a and 171b substantially extend in the second direction DR2, and may transmit data voltages, respectively. The data line 171a may include a first protrusion 172a protruding in the first direction DR1, and the data line 171b may include a second protrusion 172b protruding in the opposite direction of the first direction DR1. That is, the data lines 171a and the data line 171b may respectively include a first protrusion 172a and a second protrusion 172b protruding in opposite directions to each other. When viewed based on one pixel PX, the data line 171a disposed at the left side may include the first protrusion 172a protruding toward the data line 171b adjacent to the right side, and the data line 171b may include the second protrusion 172b protruding toward the data line 171a adjacent to the left side.

The first protrusion 172a and the second protrusion 172b are not arranged in the first direction DR1 as shown in FIG. 2 but may be slightly shifted, and alternatively, the first protrusion 172a and the second protrusion 172b may be arranged and disposed to correspond to each other in the first direction DR1.

The first source electrode 173a may be connected to the data line 171a through the first protrusion 172a.

The gate conductive layer and the data conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and alloys thereof.

Planar shapes of the data conductive layer and the ohmic contact layer 161 may be substantially the same. In an area excluding areas between the first source electrode 173a and the first drain electrode 175a, between the second source electrode 173b and the second drain electrode 175b, between the third source electrode 173c and the auxiliary electrode 174c, and between the auxiliary electrode 174c and the third drain electrode 175c, planar shapes of the data conductive layer and the semiconductor layer 151 may be substantially the same. As shown in FIG. 2, a planar area of the semiconductor layer 151 may be slightly larger than that of the data conductive layer.

The first gate electrode 124a, the first source electrode 173a, and the first drain electrode 175a form a first transistor Qa together with the first semiconductor 154a; the second gate electrode 124b, the second source electrode 173b, and the second drain electrode 175b form a second transistor Qb together with the second semiconductor 154b; and the third gate electrode 124c, the third source electrode 173c, the auxiliary electrode 174c, and the third drain electrode 175c form a third transistor Qc together with the third semiconductor 154c.

Channels of the first transistor Qa, the second transistor Qb, and the third transistor Qc are respectively formed in the first, second, and third semiconductors 154a, 154b, and 154c disposed between the first, second, and third source electrodes 173a, 173b, and 173c and the first, second, and third drain electrodes 175a, 175b, and 175c. The auxiliary electrode 174c may be formed to lengthen the channel of the third transistor Qc, but the auxiliary electrode 174c may be omitted.

The first transistor Qa, the second transistor Qb, and the third transistor Qc may overlap the expansion 124 of the gate line 121 and be arranged in the first direction DR1. For example, as shown in FIG. 2, the first transistor Qa, the second transistor Qb, and the third transistor Qc may be arranged in the first direction DR1 in order.

A first insulating layer 180a is disposed on the data conductive layer and on exposed portions of the semiconductors 154a, 154b, and 154c. The first insulating layer 180a may include an organic insulating material or an inorganic insulating material.

A color filter layer including a plurality of color filters 230, 230d, and 230e may be disposed on the first insulating layer 180a. The color filters 230, 230d, and 230e may display one of three primary colors such as red, green, and blue, or four primary colors. A group of color filters displaying different primary colors may be repeatedly disposed in the first direction DR1.

At least two of the color filters 230, 230d, and 230e adjacent to the data lines 171a and 171b may overlap each other in the third direction DR3 perpendicular to the substrate 110. The color filters 230, 230d, and 230e overlapping each other may prevent light leakage in the vicinity of the data lines 171a and 171b disposed in adjacent pixels.

A second insulating layer 180b may be disposed on the color filters 230, 230d, and 230e. The second insulating layer 180b may include an inorganic insulating material or an organic insulating material, and particularly, may have a generally flat upper surface by including the organic insulating material. The second insulating layer 180b serves as an overcoat for the color filters 230, 230d and 230e to prevent the color filters 230, 230d and 230e from being exposed and to prevent impurities such as pigments from flowing into the liquid crystal layer 3.

The first insulating layer 180a and the second insulating layer 180b may have a contact hole 185a disposed on the expansion 177a of the first drain electrode 175a, a contact hole 185b disposed on the expansion 177b of the second drain electrode 175b, and a contact hole 188 disposed on the end portion 176 of the third drain electrode 175c and on a portion of the expansion 132 of the reference voltage line 131 adjacent thereto.

As shown in FIG. 2, the contact holes 185a, 185b, and 188 may be disposed on the same side, for example, on an upper side, with respect to the gate line 121. The contact hole 185a, the contact hole 185b, and the contact hole 188 may be, in order, arranged from the left in the first direction DR1.

In each pixel PX, since a distance between the three contact holes 185a, 185b and 188 substantially arranged in a line in the first direction DR1 and a distance between the contact hole 185a or 188 adjacent to the data lines 171a and 171b and the data line 171a and 171b are not sufficient, when openings corresponding to the contact holes 185a, 185b and 188 are formed in the color filters 230, 230d and 230e, the color filters 230, 230d and 230e remaining between the contact holes 185a, 185b and 188 or the color filters 230, 230d and 230e left between the data lines 171a and 171b and the contact hole 185a or 188, may be formed to be thin. In this case, the color filters 230, 230d, and 230e left with an insufficient thickness may come off, causing display defects.

In the present embodiment, the color filters 230, 230d, and 230e corresponding to at least three contact holes 185a, 185b, and 188 may be removed to form the openings 235 to prevent the above problem.

In a plan view, the opening 235 may overlap a light blocking member 220 described later. Particularly, the opening 235 may not overlap the transistors Qa, Qb, and Qc and the second gate electrode 124b as shown in FIG. 2, or may overlap some of the transistors Qa, Qb, and Qc and the second gate electrode 124b.

Referring to FIG. 2, the opening 235 substantially extends in the first direction DR1, and it may cross the plurality of data lines 171a and 171b without being limited to one pixel PX to extend across a plurality of pixels PX in the first direction DR1.

In a plan view, the contact holes 185a, 185b, and 188 overlap the opening 235 of the color filter 230, and may be disposed in the opening 235. As described above, the color filter 230 may have the opening 235 overlapping three or more contact holes 185a, 185b, and 188 arranged in a line and provided in at least one insulating layer disposed under the color filter 230.

Referring to FIG. 5 together with FIG. 2, a display device 1000 according to an embodiment may include a display area DA capable of displaying an image. The display area DA may include a plurality of pixels PX, and the plurality of pixels PX may be substantially arranged in a matrix form.

A plurality of color filters 230a, 230b, and 230c capable of displaying different primary colors may be alternately arranged in the first direction DR1. The color filters 230, 230d, and 230e described above may correspond to the plurality of color filters 230a, 230b, and 230c, respectively.

The opening 235 formed in the plurality of color filters 230a, 230b, and 230c may continuously extend in the first direction DR1 in the display area DA. In addition, each opening 235 may cross the pixels PX arranged to be adjacent to the first direction DR1 in the first direction DR1. The plurality of openings 235 may be arranged in the second direction DR2. Accordingly, in the entire display area DA, the respective color filters 230a, 230b, and 230c may be arranged in the second direction DR2, and may include a plurality of portions that are spaced apart from each other. The color filters 230a, 230b, and 230c corresponding to the respective pixel columns may include portions arranged in the second direction DR2 apart from each other with the opening 235 therebetween.

A pitch of the plurality of openings 235 in the second direction DR2 arranged in the second direction DR2 may be the same as or similar to that of the plurality of gate lines 121 in the second direction DR2.

Unlike this, referring to FIG. 6, the respective color filters 230, 230d, and 230e corresponding to one pixel column may have a plurality of openings 235a. Each opening 235a can overlap at least three contact holes 185a, 185b, and 188 of one pixel PX. Each opening 235a may be confined to one pixel PX and be limited to between two adjacent data lines 171a and 171b. That is, one opening 235a may be disposed in each pixel PX.

A width W1 of the openings 235 and 235a in the second direction DR2 may be about half or less of that of the light blocking member 220 in the second direction DR2. For example, when the width of the light blocking member 220 in the second direction DR2 is approximately 40 micrometers to 70 micrometers, the width of the opening 235 in the second direction DR2 may be approximately 20 micrometers to 35 micrometers.

A pixel electrode layer including a plurality of first sub-pixel electrodes 191a and a plurality of second sub-pixel electrodes 191b, a shielding electrode 190, and a connecting member 90 may be disposed on the second insulating layer 180b.

The first sub-pixel electrode 191a may be disposed at one side based on an area in which the gate line 121, the reference voltage line 131, and the transistors Qa, Qb, and Qc in each pixel PX, and the second sub-pixel electrode 191b may be disposed at an opposite side thereto. In the embodiment shown in FIG. 2, the first sub-pixel electrode 191a may be disposed below the gate line 121, and the second sub-pixel electrode 191b may be disposed above the gate line 121. Specific shapes of the first sub-pixel electrode 191a and the second sub-pixel electrode 191b will be described later.

The first sub-pixel electrode 191a may include an extension 196a protruding toward the expansion 177a of the first drain electrode 175a and a contact portion 197a connected to an end of the extension 196a, and the second sub-pixel electrode 191b may include an extension 196b protruding toward the expansion 177b of the second drain electrode 175b and a contact portion 197b connected to an end of the extension 196b. The contact portion 197a is electrically connected to the expansion 177a of the first drain electrode 175a through the contact hole 185a, and the contact portion 197b is electrically connected to the expansion 177b of the second drain electrode 175b through the contact hole 185b.

The extension 196a may protrude upward from an upper left edge portion of the first sub-pixel electrode 191a, and may extend upwardly to cross the first protrusion 172a of the data line 171a. The extension 196a may extend between a portion of the data line 171a extending in the second direction DR2 and the first transistor Qa. The extension 196a may overlap an edge portion of the expansion 124 of the gate line 121, or may not overlap it as shown in FIG. 2.

The extension 196b may protrude from a substantially central portion of a lower portion of the second sub-pixel electrode 191b.

The first sub-pixel electrode 191a may further include an extension 196aa disposed at an opposite side of the extension 196a. That is, the extension 196aa may protrude upward from an upper right edge portion of the first sub-pixel electrode 191a. The extension 196aa may extend upward to cross the second protrusion 172b protruding to the left side of the other data line 171b adjacent to the data line 171a. An area in which the extension 196a and the first protrusion 172a cross and overlap each other and an area in which the extension 196aa and the second protrusion 172b cross and overlap each other may be the same or similar to each other.

The connecting member 90 is in contact with and is electrically connected to the end portion 176 of the third drain electrode 175c and a portion of the expansion 132 of the reference voltage line 131 adjacent thereto through the contact hole 188. Accordingly, the end portion 176 of the third drain electrode 175c may be electrically connected to the expansion 132 of the reference voltage line 131 through the conductive connecting member 90 to receive the reference voltage Vref. Therefore, the third drain electrode 175c of the third transistor Qc may be connected to the reference voltage Vref.

The shielding electrode 190 substantially extends in the second direction DR2, and may be disposed between two adjacent pixels PX. The shielding electrode 190 may overlap the data lines 171a and 171b to shield an electric field from the data lines 171a and 171b, and may prevent capacitive coupling between the data lines 171a and 171b and the first and second sub-pixel electrodes 191a and 191b and light leakage due to the capacitive coupling.

The pixel electrode layer may include a transparent conductive material such as an indium tin oxide (ITO), an indium zinc oxide (IZO), a metal thin film, or the like.

An alignment layer 11 may be disposed on the pixel electrode layer and the second insulating layer 180b. The alignment layer 11 may be a vertical alignment layer. The alignment layer 11 may be rubbed in at least one direction, or may be a photoalignment layer including a photoreactive material.

In the second display panel 200, the light blocking member 220 (which is disposed below a substrate 210 in FIG. 3 and FIG. 4) may be disposed on the insulating substrate 210. As shown in FIG. 2, the light blocking member 220 may include a portion extending in the first direction DR1 in a plan view, and may overlap the expansion 124 of the gate line 121, the expansion 132 of the reference voltage line 131, the transistors Qa, Qb, and Qc, the expansion 177a of the first drain electrode 175a, the expansion 177b of the second drain electrode 175b, and the end portion 176 of the third drain electrode 175c. That is, the light blocking member 220 may extend between the first sub-pixel electrode 191a and the second sub-pixel electrode 191b while traversing them, and may extend while overlapping the gate line 121 and the reference voltage line 131.

According to another embodiment, the light blocking member 220 may be disposed on the first display panel 100 instead of the second display panel 200.

A common electrode 270 (which is disposed below the light blocking member 220 in FIG. 3 and FIG. 4) may be disposed on the light blocking member 220. The common electrode 270 may be formed as a whole plate on an entire surface of the substrate 210. That is, the common electrode 270 may have no removed portion such as a slit. The common electrode 270 may transmit a common voltage Vcom having a constant magnitude.

The reference voltage Vref transmitted from the reference voltage line 131 may be equal to or different from the common voltage Vcom. When there is a difference, the reference voltage Vref may have a potential of approximately −2 V or +2 V of the common voltage Vcom.

The common electrode 270 may include a transparent conductive material such as an ITO, an IZO, or a metal thin film.

An alignment layer 21 (which is disposed below the common electrode 270 in FIG. 3 and FIG. 4) may be disposed on the common electrode 270. The alignment layer 21 may be a vertical alignment layer. The alignment layer 21 may be rubbed in at least one direction, or may be a photoalignment layer including a photoreactive material.

The liquid crystal layer 3 includes a plurality of liquid crystal molecules 31. The liquid crystal molecules 31 may have a negative dielectric anisotropy, and may be aligned in a direction substantially perpendicular to the substrates 110 and 210 in a state in which no electric field is generated in the liquid crystal layer 3. The liquid crystal molecules 31 may have a pretilt in a certain direction when no electric field is generated in the liquid crystal layer 3.

The first sub-pixel electrode 191a may form the first liquid crystal capacitor Clca together with the common electrode 270 and the liquid crystal layer 3 therebetween, and the second sub-pixel electrode 191b may form the second liquid crystal capacitor Clcb together with the common electrode 270 and the liquid crystal layer 3 therebetween.

A plurality of spacers may be disposed between the first display panel 100 and the second display panel 200. The spacers may be disposed to mainly overlap the transistors Qa, Qb, and Qc in a plan view. When the pixel electrode layer overlaps the spacer, a crack may occur in the pixel electrode layer, so that the pixel electrode layer may not overlap the spacer. Accordingly, the extensions 196a and 196aa of the first sub-pixel electrode 191a may be disposed to protrude at the left and right edges of the first sub-pixel electrode 191a, adjacent to the data lines 171a and 171b.

According to the embodiment, the contact hole 185a, the contact hole 185b, and the contact hole 188 included in one pixel PX are disposed on the same side with respect to the gate line 121 and arranged to be parallel in the first direction DR1. Therefore, since a space occupied by the contact holes 185a, 185b, and 188 is less than that of a case in which the contact holes 185a, 185b, and 188 are dispersed and disposed above and below the gate line 121, a width of the light blocking member 220 in the second direction DR2 may be further reduced, so that an aperture ratio and transmittance of the pixel PX may be increased.

Since the contact holes 185a, 185b and 188 are disposed on the same side with respect to the gate line 121 in one pixel PX, one of the extension 196a of the first sub-pixel electrode 191*a* and the extension 196*b* of the second sub-pixel electrode 191*b* should cross one of the first protrusion 172*a* and the second protrusion 172*b* of the data lines 171*a* and 171*b*. In the embodiment shown in FIG. 2, since the contact holes 185*a*, 185*b*, and 188 are disposed above the gate line 121, the extension 196*a* of the first sub-pixel electrode 191*a* disposed below the gate line 121 crosses the first protrusion 172*a* of the data line 171*a*. In this case, a spot due to vertical crosstalk may be viewed due to the parasitic capacitance between the first sub-pixel electrode 191*a* and the data line 171*a*, however, in the present embodiment, the extension 196*aa* disposed at the opposite side of the extension 196*a* of the first sub-pixel electrode 191*a* crosses the data line 171*b* adjacent to the data line 171*a* to form an additional parasitic capacitance, so that the vertical crosstalk between the first sub-pixel electrode 191*a* and the data line 171*a* may be compensated.

Hereinafter, a display device according to an embodiment will be described with reference to FIG. 7 and FIG. 8 together with the drawings described above.

Figure 7:
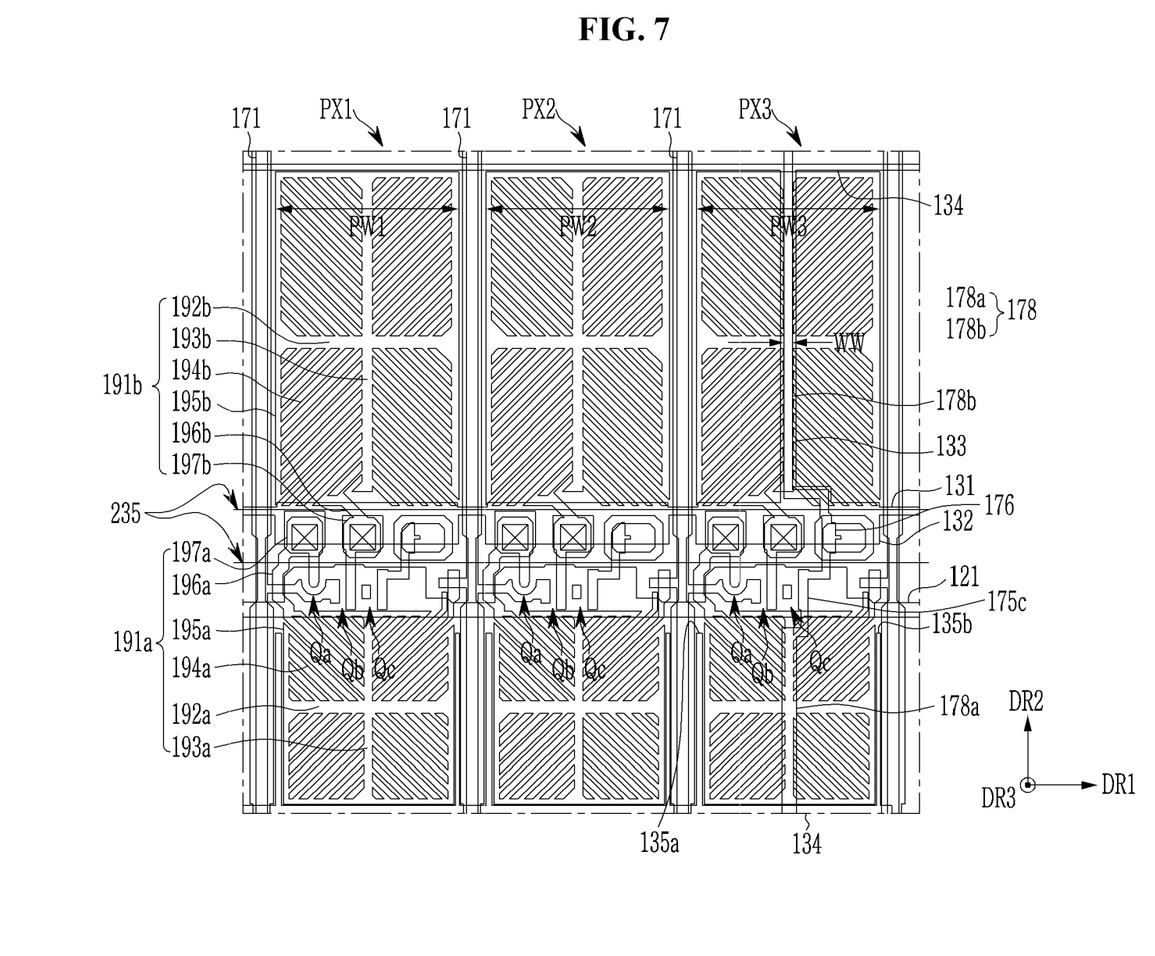
FIG. 7 illustrates a layout diagram of three pixels of a display device according to an embodiment.
Figure 8:
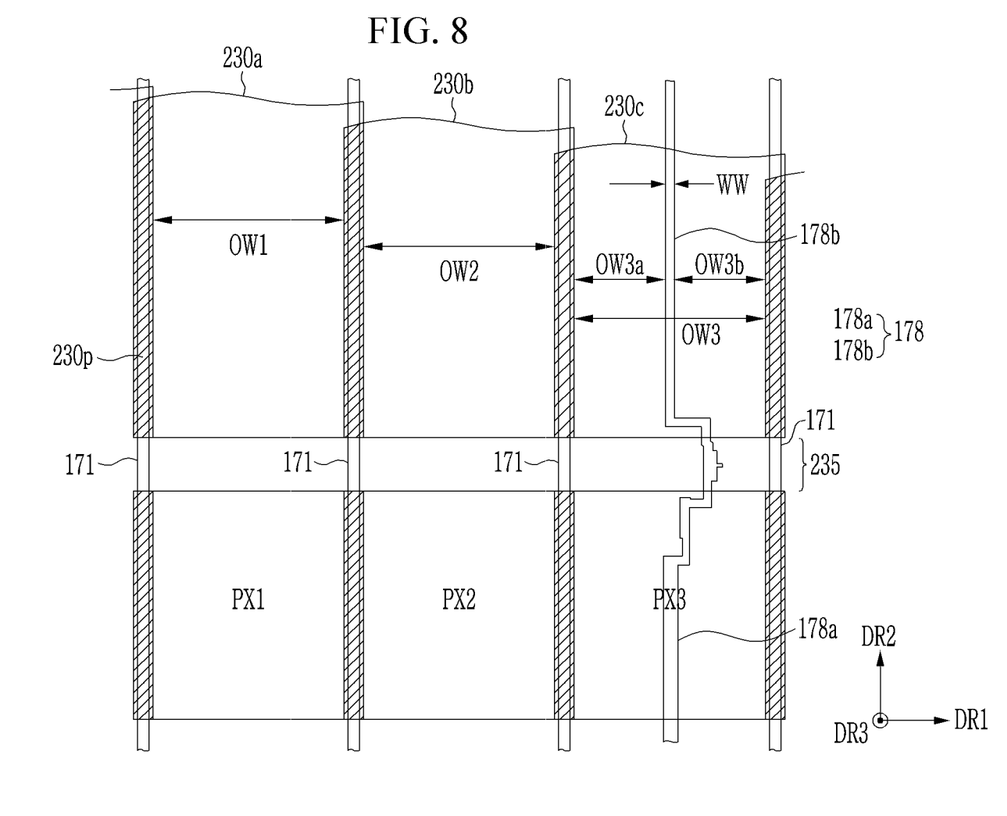
FIG. 8 illustrates a layout diagram of three color filters of three pixels of a display device according to an embodiment.

FIG. 7 illustrates a layout diagram of three pixels PX1, PX2, and PX3 of a display device according to an embodiment, and FIG. 8 illustrates a layout diagram of three color filters of the three pixels PX1, PX2, and PX3 of a display device according to an embodiment.

In the shapes of the first sub-pixel electrode 191*a* and the second sub-pixel electrode 191*b* disposed in the pixels PX1, PX2, and PX3, an overall shape of each of the first sub-pixel electrode 191*a* and the second sub-pixel electrode 191*b* may be a quadrangular shape.

The first sub-pixel electrode 191*a* may include a cross-shaped stem portion including a horizontal stem portion 192*a* and a vertical stem portion 193*a*, a plurality of branch portions 194*a* outwardly extending from the cross-shaped stem portion, an edge portion 195*a* defining a side of an outer edge, and the extension 196*a* and the contact portion 197*a* described above.

The second sub-pixel electrode 191*b* may include a cross-shaped stem portion including a horizontal stem portion 192*b* and a vertical stem portion 193*b*, a plurality of branch portions 194*b* outwardly extending from the cross-shaped stem portion, an edge portion 195*b* defining a side of an outer edge, and the extension 196*b* and the contact portion 197*b* described above.

A planar area of the first sub-pixel electrode 191*a* may be smaller than that of the second sub-pixel electrode 191*b*.

A primary color of the color filter 230 corresponding to a pixel column at which the pixel PX1 is disposed, a primary color of the color filter 230 corresponding to a pixel column at which the pixel PX2 is disposed, and a primary color of the color filter 230 corresponding to a pixel column at which the pixel PX3 is disposed may be different. For example, the pixel PX1 may correspond to a red color filter, the pixel PX2 may correspond to a green color filter, and the pixel PX3 may correspond to a blue color filter.

The reference voltage line 131 may include, in addition to a portion extending in the first direction DR1 in which the expansion 132 is disposed, a vertical portion 133 extending in the second direction DR2, a horizontal portion 134 connected to the vertical portion 133, and vertical portions 135*a* and 135*b* that are connected to the horizontal portion 134 and are disposed at left and right sides of the first sub-pixel electrode 191*a* and extend in the second direction DR2. The horizontal portion 134 may be disposed to correspond to a boundary between two adjacent pixels in the second direction DR2.

The vertical portion 133 is not disposed in all of the pixels PX1, PX2, and PX3, but may be disposed in the pixel PX3. For example, the vertical portion 133 may extend while overlapping the vertical stem portion 193*b* of the second sub-pixel electrode 191*b* of the pixel PX3. The vertical portions 135*a* and 135*b* may be disposed in all three pixels PX1, PX2, and PX3.

Referring to FIG. 7, a structure of at least one pixel PX3 among a plurality of adjacent pixels PX1, PX2, and PX3 in the display device according to the embodiment may be partially different from structures of the remaining pixels PX1 and PX2. For example, the data conductive layer may further include a vertical reference voltage line 178 overlapping the pixel PX3.

The vertical reference voltage line 178 may transmit the reference voltage Vref. The vertical reference voltage line 178 may include a vertical portion 178*a* that overlaps and crosses the first sub-pixel electrode 191*a* of at least one pixel PX3 among the plurality of pixels PX1, PX2, and PX3, and a vertical portion 178*b* that overlaps and crosses the first sub-pixel electrode 191*b* thereof. The vertical portions 178*a* and 178*b* of the vertical reference voltage line 178 may substantially extend in the second direction DR2.

The vertical reference voltage line 178 may include a third drain electrode 175*c*. In other words, an end portion 176 of the third drain electrode 175*c* may extend further upward to be connected to a vertical portion 178*b* of the vertical reference voltage line 178, and a lower end portion of the third drain electrode 175*c* may extend further downward to be connected to the vertical portion 178*a* of the vertical reference voltage line 178.

The vertical portion 178*a* of the vertical reference voltage line 178 may extend while overlapping the vertical stem portion 193*a* of the first sub-pixel electrode 191*a* of the pixel PX3, and the vertical portion 178*b* thereof may extend while overlapping the vertical stem portion 193*b* of the second sub-pixel electrode 191*b* of the pixel PX3. The vertical reference voltage line 178 may transmit the reference voltage Vref in the second direction DR2 in the display device.

Thus, by transmitting the reference voltage Vref in the first direction DR1 through the reference voltage line 131 and transmitting the reference voltage Vref in the second direction DR2 through the vertical reference voltage line 178, a resistance value of a wire for transmitting the reference voltage Vref may be reduced, so that a voltage drop of the reference voltage Vref may be reduced, thereby preventing planar horizontal crosstalk from occurring.

The vertical reference voltage line 178 may be spaced apart from the adjacent data line 171, and may not cross the data line 171.

Since the vertical reference voltage line 178 is disposed to correspond to only some of the pixels PX3, a pitch of the vertical reference voltage line 178 in the first direction DR1 may be larger than those of the pixels PX1, PX2, and PX3. More specifically, the pitch of the vertical reference voltage lines 178 in the first direction DR1 may be approximately three times or more the pitches of the pixels PX1, PX2, and PX3 in the first direction DR1 (or the pitches of the first and second sub-pixel electrodes 191*a* and 191*b* in the first direction DR1).

A width PW3 in the first direction DR1 of the pixel electrode (the first sub-pixel electrode 191*a* or the second sub-pixel electrode 191*b*) disposed in the pixel PX3 among the plurality of pixels PX1, PX2, and PX3 may be larger than widths PW1 and PW2 in the first direction DR1 of the pixel electrode (the first sub-pixel electrode 191*a* or the second sub-pixel electrode 191*b*) disposed in the remaining pixels PX1 and PX2. Specifically, a difference between the width PW3 in the first direction DR1 of the pixel electrode disposed in the pixel PX3 and the widths PW1 and PW2 in the first direction DR1 of the pixel electrode disposed in the pixels PX1 and PX2 may be approximately equal or similar to a width WW of the vertical reference voltage line 178 in the first direction DR1. Thus, an area of an effective aperture that is an area through which light may pass in the pixel PX3 overlapping the vertical reference voltage line 178 may be similar to areas of effective apertures of the pixels PX1 and PX2 that do not overlap the vertical reference voltage line 178.

For example, when the width WW of the vertical reference voltage line 178 in the first direction DR1 is approximately 3 micrometers and the widths PW1 and PW2 in the first direction DR1 of the pixel electrodes disposed in the pixels PX1 and PX2 are approximately 104 micrometers, the width PW3 in the first direction DR1 of the pixel electrode disposed in the pixel PX3 may be approximately 107 micrometers.

As described above, by relatively increasing the width in the first direction DR1 of the pixel electrode of the pixel PX3 in consideration of the aperture ratio that is reduced by the vertical reference voltage line 178 traversing the pixel PX3, the overall aperture ratio and transmittance of the pixel PX3 may be substantially equal to the overall aperture ratio and transmittance of the remaining pixels PX1 and PX2. Thus, even when the vertical reference voltage line 178 additionally overlaps the pixel PX3 among the plurality of pixels PX1, PX2, and PX3, it is possible to prevent occurrence of defects in color expression that may occur due to the decrease in the aperture ratio and transmittance of the pixel PX3 (which corresponds to some of the pixels).

In the present embodiment, a distance between two adjacent data lines 171 disposed at opposite sides of the pixel PX3 may be larger than that between two adjacent data lines 171 disposed at opposite sides of the remaining pixels PX1 and PX2. Areas of the first and second sub-pixel electrodes 191a and 191b included in the pixel PX3 may be larger than those of the first and second sub-pixel electrodes 191a and 191b included in the other pixels PX1 and PX2.

Referring to FIG. 8, at least two adjacent ones of the plurality of color filters 230a, 230b, and 230c overlap each other in an area overlapping the data lines 171a and 171b to form an overlapped portion 230p.

When the area of the effective aperture of each of the pixels PX1, PX2, and PX3 is defined as an area between two adjacent overlapped portions 230p, the area of the effective aperture of the pixel PX3 among the plurality of pixels PX1, PX2, and PX3 may be the same or similar to a sum of a width OW3a of the left portion and a width OW3b of the right portion in which a width WW in the first direction DR1 of the vertical reference voltage line 178 is subtracted from a width OW3 in the first direction DR1 between the two adjacent overlapped portions 230p. The width of the area of the effective aperture of the pixel PX3 in the first direction DR1 may be similar to the widths OW1 and OW2 of the areas of the effective apertures of the pixels PX1 and PX2 in the first direction DR1, respectively.

The pixel PX3 through which the vertical reference voltage line 178 passes may be a pixel for displaying blue, but the vertical reference voltage line 178 is not limited thereto, and may cross a pixel for displaying red or green. In addition, the number of the pixels PX3 through which the vertical reference voltage line 178 passes among the plurality of pixels PX1, PX2, and PX3 repeated in one group may be one, but is not limited thereto, and may be two.

In comparative displays, the first subpixel electrode and the second subpixel electrode are spaced apart with the gate line and the transistors are disposed therebetween, resulting in the contact holes being dispersed at both sides with respect to the gate line. In accordance with the inventive concepts, the contact holes for a pixel disposed between the first subpixel electrode and the second subpixel electrode may be arranged in a row, so that the black matrix may have a reduced width. Further, one opening corresponding to the aligned contact holes may be provided in the color filter such that defects caused by small pieces of the color filter when a plurality of openings are formed for each of the contact holes, may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate;
    a gate line disposed on the substrate and configured to transmit a gate signal;
    a first reference voltage line spaced apart from the gate line and configured to transmit a reference voltage;
    a second reference voltage line disposed on the gate line and the first reference voltage line and electrically connected to the first reference voltage line;
    an insulating layer disposed on the second reference voltage line; and
    a pixel electrode layer disposed on the insulating layer,
    wherein the pixel electrode layer comprises a first pixel electrode comprising a first sub-pixel electrode disposed at a first side with respect to the gate line in a plan view and a second sub-pixel electrode disposed at a second side opposite to the first side with respect to the gate line in the plan view, and
    the second reference voltage line overlaps the first pixel electrode and crosses the first pixel electrode.

2. The display device of claim 1, further comprising a plurality of data lines crossing the gate line and the first reference voltage line,
    wherein the second reference voltage line is spaced apart from each data line and does not cross the data lines.

3. The display device of claim 2, wherein the second reference voltage line is disposed in a same conductive layer as the plurality of data lines.

4. The display device of claim 3, wherein:
    the gate line comprises a first gate electrode, a second gate electrode, and a third gate electrode,
    the display device further comprises:
    a first transistor comprising the first gate electrode, a first source electrode, and a first drain electrode;
    a second transistor comprising the second gate electrode, a second source electrode, and a second drain electrode; and
    a third transistor comprising the third gate electrode, a third source electrode, and a third drain electrode,
    the insulating layer has a first contact hole disposed on the first drain electrode, a second contact hole disposed on the second drain electrode, and a third contact hole disposed on the third drain electrode,
    the first sub-pixel electrode is electrically connected to the first drain electrode through the first contact hole, the second sub-pixel electrode is electrically connected to the second drain electrode through the second contact hole, and the first contact hole, the second contact hole, and the third contact hole are disposed at a same side with respect to the gate line.

5. The display device of claim 4, wherein:
the first reference voltage line comprises a first expansion overlapping the third contact hole,
the third contact hole overlaps a portion of the third drain electrode and a portion of the first expansion, and
the pixel electrode layer further comprises a connecting member that electrically connects the third drain electrode and the first expansion through the third contact hole.

6. The display device of claim 5, wherein the second reference voltage line comprises the third drain electrode, and is disposed in a same conductive layer as the third drain electrode.

7. The display device of claim 6, wherein the first sub-pixel electrode comprises a stem portion overlapping and extending in parallel to the second reference voltage line in a plan view, and a plurality of branches connected to the stem portion.

8. The display device of claim 4, further comprising a color filter overlapping the first pixel electrode,
wherein the color filter has an opening overlapping all of the first contact hole, the second contact hole, and the third contact hole.

9. The display device of claim 8, wherein the opening crosses the plurality of data lines.

10. The display device of claim 1, wherein:
a plurality of the second reference voltage lines are arranged in a first direction,
a plurality of the first pixel electrodes are arranged in the first direction, and
a pitch of the plurality of second reference voltage lines in the first direction is larger than a pitch of the plurality of first pixel electrodes in the first direction.

11. The display device of claim 10, wherein:
the pixel electrode layer comprises a second pixel electrode spaced apart from the first pixel electrode, and
a width of the first pixel electrode in the first direction is larger than a width of the second pixel electrode in the first direction.

12. A display device comprising:
a substrate;
a gate line disposed on the substrate and configured to transmit a gate signal;
a plurality of data lines disposed on the substrate, configured to transmit a data voltage, and crossing the gate line;
an insulating layer disposed on the plurality of data lines; and
a plurality of color filters disposed on the insulating layer,
wherein one of the plurality of color filters comprises an opening overlapping three or more contact holes arranged in a line and provided in the insulating layer.

13. The display device of claim 12, wherein the opening extends in a direction crossing the plurality of data lines.

14. The display device of claim 13, wherein:
the plurality of color filters are arranged in a first direction,
the one of the plurality of color filters comprises a plurality of portions that are arranged in a second direction crossing the first direction, and spaced apart from each other with the opening therebetween,
the three or more contact holes are arranged in the first direction, and
the opening extends in the first direction.

15. The display device of claim 14, wherein a pitch of a plurality of the gate lines in the second direction matches a pitch of a plurality of the openings in the second direction.

16. The display device of claim 14, further comprising:
a first sub-pixel electrode disposed at a first side with respect to the gate line; and
a second sub-pixel electrode disposed at a second side opposite to the first side with respect to the gate line,
wherein the opening is disposed between the first sub-pixel electrode and the second sub-pixel electrode.

17. A display device comprising:
a gate line configured to transmit a gate signal;
a first reference voltage line spaced apart from the gate line and configured to transmit a reference voltage;
a plurality of data lines crossing the gate line and the first reference voltage line;
a first transistor electrically connected to the gate line and the data lines;
a second transistor electrically connected to the gate line and the data lines;
a third transistor electrically connected to the second transistor; and
a second reference voltage line configured to transmit the reference voltage and disposed in a different conductive layer from the first reference voltage line,
wherein a drain electrode included in the third transistor is electrically connected to the first reference voltage line,
the second reference voltage line comprises the drain electrode of the third transistor, and
the second reference voltage line crosses the first reference voltage line.

18. The display device of claim 17, further comprising:
a first pixel electrode comprising a first sub-pixel electrode electrically connected to the first transistor, and a second sub-pixel electrode electrically connected to the second transistor,
wherein the second reference voltage line overlaps the first pixel electrode and crosses the first pixel electrode.

19. The display device of claim 18, further comprising:
a second pixel electrode spaced apart from the first pixel electrode,
wherein a width of the first pixel electrode in a first direction is larger than a width of the second pixel electrode in the first direction.

20. The display device of claim 18, further comprising:
a color filter overlapping the first and second sub-pixel electrodes,
wherein the color filter comprises an opening crossing the plurality of data lines.

* * * * *